(12) United States Patent
Cabanillas et al.

(10) Patent No.: US 8,803,615 B2
(45) Date of Patent: Aug. 12, 2014

(54) IMPEDANCE MATCHING CIRCUIT WITH TUNABLE NOTCH FILTERS FOR POWER AMPLIFIER

(75) Inventors: Jose Cabanillas, San Diego, CA (US); Calogero D. Presti, San Diego, CA (US); Babak Nejati, San Diego, CA (US); Guy Klemens, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/356,508

(22) Filed: Jan. 23, 2012

(65) Prior Publication Data

US 2013/0187712 A1     Jul. 25, 2013

(51) Int. Cl.
*H03F 3/191*     (2006.01)

(52) U.S. Cl.
USPC .......................................... 330/305; 330/302

(58) Field of Classification Search
USPC .................. 330/192, 302, 305, 306
See application file for complete search history.

(56) References Cited

U.S. PATENT DOCUMENTS

| | | | |
|---|---|---|---|
| 4,375,051 A | 2/1983 | Theall | |
| 6,023,611 A * | 2/2000 | Bolin et al. | 455/114.1 |
| 6,392,491 B1 * | 5/2002 | Ohkawa et al. | 330/302 |
| 6,842,086 B1 | 1/2005 | Zennamo, Jr. | |
| 6,859,104 B2 * | 2/2005 | Toncich et al. | 330/302 |
| 7,092,691 B2 | 8/2006 | Bohn et al. | |
| 7,102,429 B2 * | 9/2006 | Stengel et al. | 330/136 |
| 7,151,411 B2 * | 12/2006 | Martin et al. | 330/305 |
| 7,187,231 B2 * | 3/2007 | McGrath et al. | 330/302 |
| 7,202,734 B1 * | 4/2007 | Raab | 330/126 |
| 7,440,729 B2 * | 10/2008 | Solski et al. | 455/46 |
| 7,907,033 B2 | 3/2011 | Morris, III | |
| 2003/0011443 A1 | 1/2003 | Liu et al. | |
| 2005/0168152 A1 | 8/2005 | Blackburn et al. | |
| 2005/0233764 A1 | 10/2005 | Solski et al. | |
| 2007/0057731 A1 * | 3/2007 | Le | 330/305 |
| 2009/0174496 A1 | 7/2009 | Van Bezooijen | |
| 2010/0164645 A1 | 7/2010 | Kobayashi et al. | |
| 2010/0308933 A1 | 12/2010 | See et al. | |
| 2012/0106524 A1 * | 5/2012 | Brobston et al. | 370/338 |

FOREIGN PATENT DOCUMENTS

| | | |
|---|---|---|
| EP | 2124346 A2 | 11/2009 |
| WO | 2011001769 A1 | 1/2011 |

OTHER PUBLICATIONS

De Luis, Javier R. et al., "A Novel Frequency Control Loop for Tunable Notch Filters", IEEE Transactions on Microwave Theory and Techniques, Sep. 1, 2011, IEEE Service Center, Piscataway, NJ, US, vol. 59, No. 9, pp. 2265-2274, XP011359368, ISSN: 0018-9480, DOI: 10.1109/TMTT.2011.2160962.
Partial International Search Report—PCT/US2013/022802—ISA/EPO—Mar. 13, 2013.
He X et al., "Design and Modelling of 11-13 a Low Phase Noise PII Frequency Synthesizer", Solid-State and Integrated Circuit Technology, 2006, ICSICT '06. 8th International Conference on, IEEE, PI, Jan. 1, 2006, pp. 1571-1573, XP031045956, ISBN: 978-1-4244-0160-4.
International Search Report and Written Opinion—PCT/US2013/022802—ISA/EPO—Jun. 19, 2013.

\* cited by examiner

*Primary Examiner* — Khanh V Nguyen
(74) *Attorney, Agent, or Firm* — Ramin Mobarhan

(57) ABSTRACT

An impedance matching circuit with at least one tunable notch filter for a power amplifier is disclosed. The power amplifier amplifies an input radio frequency (RF) signal and provides an amplified RF signal. The impedance matching circuit performs output impedance matching for the power amplifier and includes at least one tunable notch filter. Each tunable notch filter has a notch that can be varied in frequency to provide better attenuation of an undesired signal. The at least one tunable notch filter attenuates at least one undesired signal in the amplified RF signal. The at least one tunable notch filter may include (i) a first tunable notch filter to attenuate a first undesired signal at a second harmonic of the amplified RF signal and/or (ii) a second tunable notch filter to attenuate a second undesired signal at a third harmonic of the amplified RF signal.

20 Claims, 10 Drawing Sheets

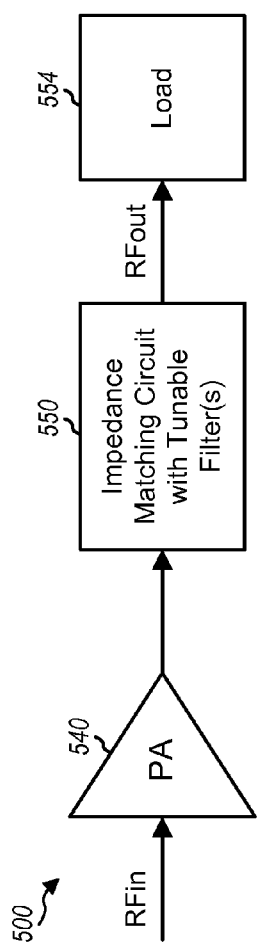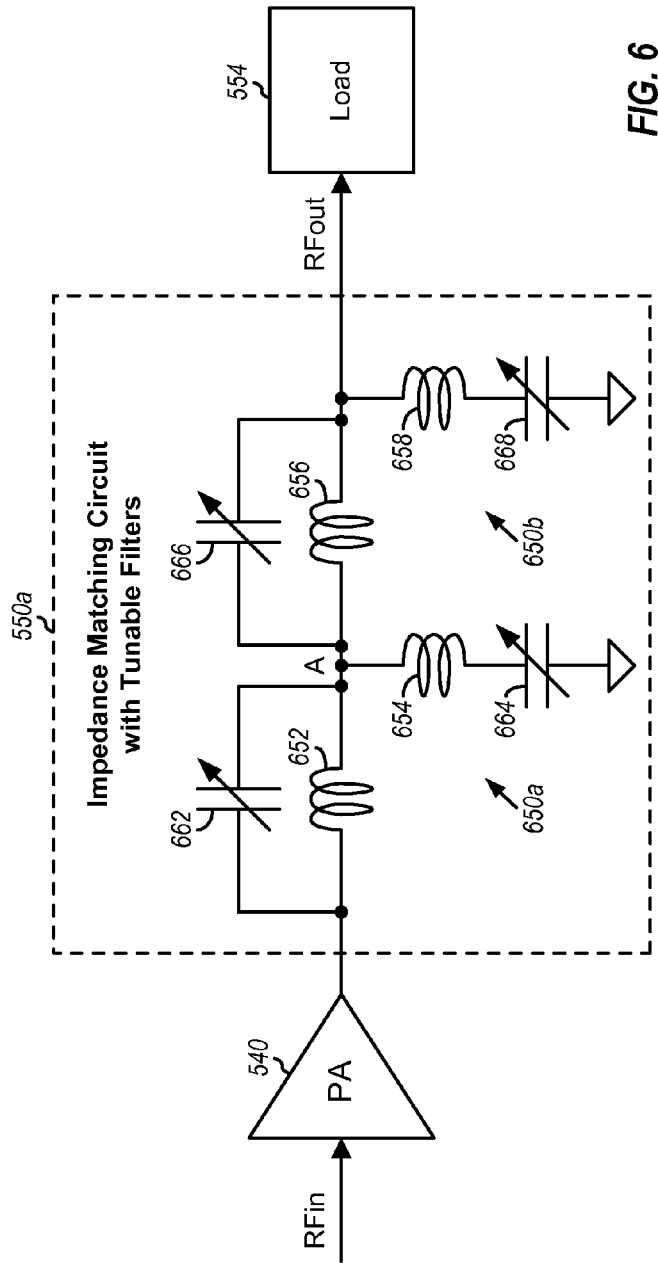

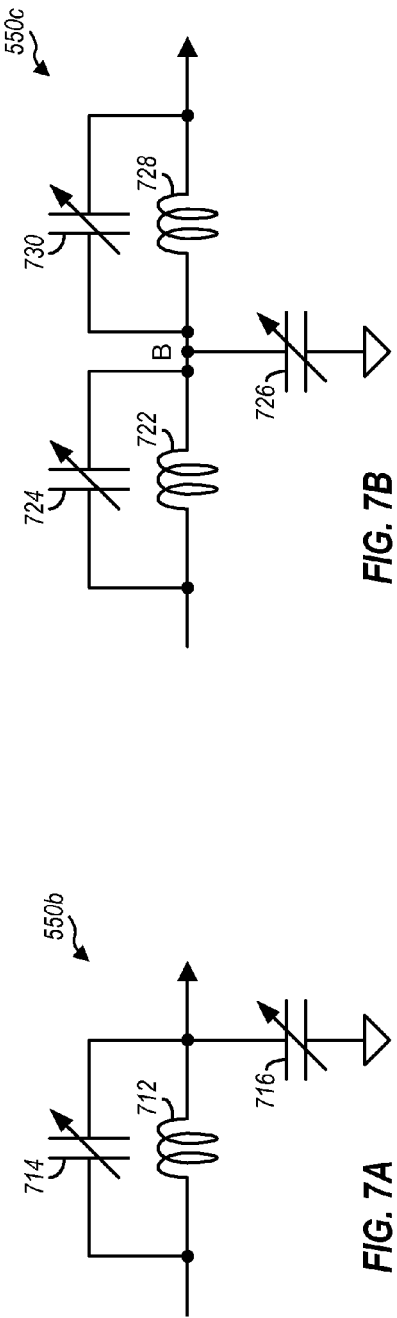
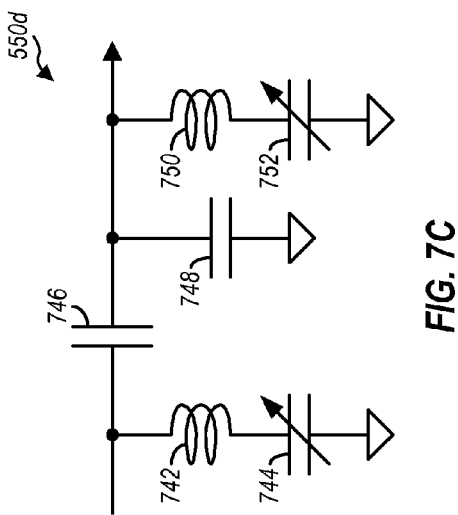
FIG. 7B
FIG. 7C
FIG. 7A

IMPEDANCE MATCHING CIRCUIT WITH TUNABLE NOTCH FILTERS FOR POWER AMPLIFIER

BACKGROUND

I. Field

The present disclosure relates generally to electronics, and more specifically to an impedance matching circuit for a power amplifier.

II. Background

A wireless device (e.g., a cellular phone or a smart phone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated RF signal, amplify the modulated RF signal to obtain an output RF signal having the proper output power level, and transmit the output RF signal via an antenna to a base station. For data reception, the receiver may obtain a received RF signal via the antenna and may condition and process the received RF signal to recover data sent by the base station.

The transmitter may support operation over a wide frequency range. The transmitter may include many circuits (e.g., amplifiers and filters) in order to meet the required specifications for the transmitter over the wide frequency range. These circuits may increase the size and cost of the transmitter.

BRIEF DESCRIPTION OF THE DRAWINGS

FIG. 5 shows a block diagram of a power amplifier module.

FIG. 6 shows a schematic diagram of an impedance matching circuit with tunable notch filters.

FIGS. 7A to 7C show schematic diagrams of three impedance matching circuits with tunable notch filters.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

An impedance matching circuit with at least one tunable notch filter for a power amplifier is described herein. This impedance matching circuit may be used for wireless devices and other electronics devices.

Figure 1:
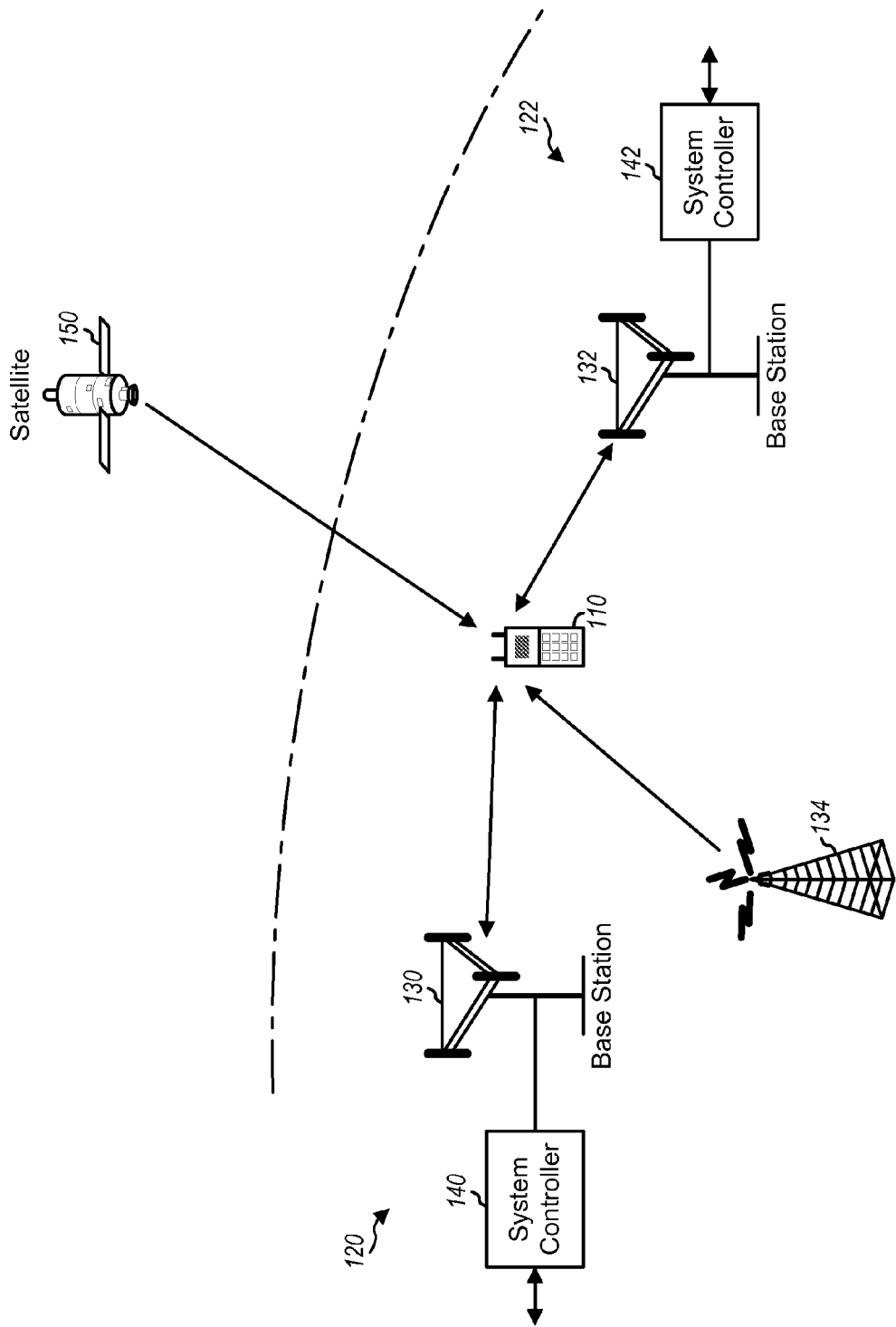
FIG. 1 shows a wireless device capable of communicating with different wireless communication systems.

FIG. 1 shows a wireless device 110 capable of communicating with different wireless communication systems 120 and 122. Wireless systems 120 and 122 may each be a Code Division Multiple Access (CDMA) system, a Global System for Mobile Communications (GSM) system, a Long Term Evolution (LTE) system, a wireless local area network (WLAN) system, or some other wireless system. A CDMA system may implement Wideband CDMA (WCDMA), cdma2000, or some other version of CDMA. For simplicity, FIG. 1 shows wireless system 120 including one base station 130 and one system controller 140, and wireless system 122 including one base station 132 and one system controller 142. In general, each wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smart phone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may be capable of communicating with wireless system 120 and/or 122. Wireless device 110 may also be capable of receiving signals from broadcast stations (e.g., a broadcast station 134). Wireless device 110 may also be capable of receiving signals from satellites (e.g., a satellite 150) in one or more global navigation satellite systems (GNSS). Wireless device 110 may support one or more radio technologies for wireless communication such as LTE, cdma2000, WCDMA, GSM, IEEE 802.11, etc.

Figure 2:
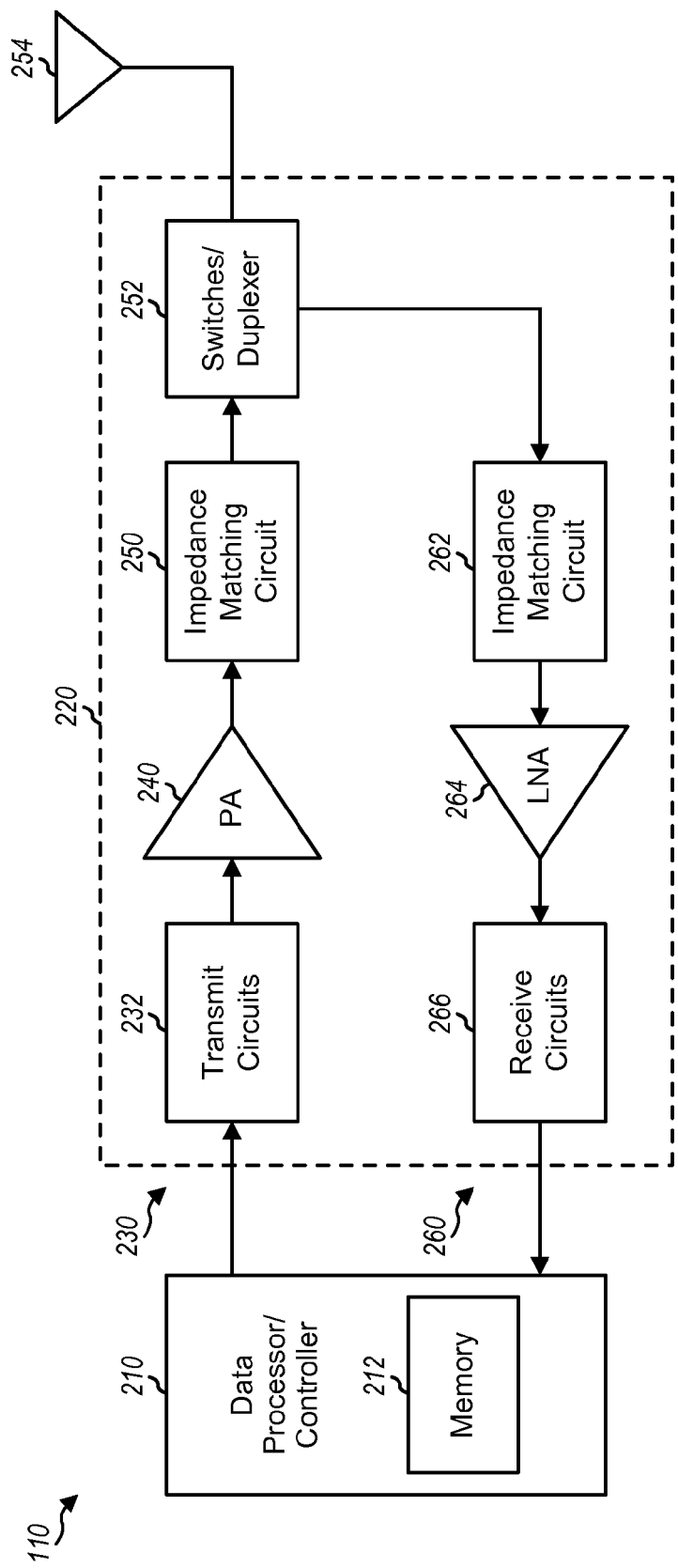
FIG. 2 shows a block diagram of the wireless device in FIG. 1.

FIG. 2 shows a block diagram of an exemplary design of wireless device 110. In this exemplary design, wireless device 110 includes a data processor/controller 210, a transceiver 220, and an antenna 254. Transceiver 220 includes a transmitter 230 and a receiver 260 that support bi-directional wireless communication.

In the transmit path, data processor 210 processes (e.g., encodes and modulates) data to be transmitted and provides an analog output signal to transmitter 230. Within transmitter 230, transmit circuits 232 amplify, filter, and upconvert the analog output signal from baseband to RF and provide an input RF signal. Transmit circuits 232 may include amplifiers, filters, mixers, impedance matching circuits, an oscillator, a local oscillator (LO) generator, a phase locked loop (PLL), etc. A power amplifier (PA) 240 receives and amplifies the input RF signal and provides an amplified RF signal having the proper output power level. An impedance matching circuit 250 performs output impedance matching for power amplifier 240. Matching circuit 250 receives the amplified RF signal from power amplifier 240 and provides an output RF signal, which is routed through switches/duplexer 252 and transmitted via antenna 254.

In the receive path, antenna 254 receives signals from base stations and/or other transmitter stations and provides a received RF signal, which is routed through switches/duplexer 252 provided to receiver 260. Within receiver 260, an impedance matching circuit 262 performs input impedance matching for a low noise amplifier (LNA) 264. LNA 264 amplifies the received RF signal from matching circuit 262 and provides an amplified signal. Receive circuits 266 amplify, filter, and downconvert the amplified signal from RF to baseband and provide an analog input signal to data processor 210. Receive circuits 266 may include amplifiers, filters, mixers, impedance matching circuits, an oscillator, an LO generator, a PLL, etc.

FIG. 2 shows an exemplary design of transmitter 230 and receiver 260.

Transmitter 230 and/or receiver 260 may include different and/or additional circuits not shown in FIG. 2. For example, transmitter 230 may include a driver amplifier prior to power amplifier 240. All or a portion of transceiver 220 may be implemented on one or more analog integrated circuits (ICs), RF ICs (RFICs), mixed-signal ICs, etc. For example, transmit circuits 232, power amplifier 240, LNA 264, receive circuits 266, and impedance matching circuits 250 and 262 may be implemented on an RFIC. Power amplifier 240 and possibly other circuits may also be implemented on a separate IC or module. Matching circuit 250 and/or 262 and possibly other circuits may also be implemented on a separate IC or module.

Data processor/controller 210 may perform various functions for wireless device 110. For example, data processor 210 may perform processing for data being transmitted via transmitter 230 and received via receiver 260. Controller 210 may control the operation of transmit circuits 232, receive circuits 266, power amplifier 240, matching circuit 250 and/or 262, switches/duplexer 252, etc. A memory 212 may store program codes and data for data processor/controller 210. Data processor/controller 210 may be implemented on one or more application specific integrated circuits (ASICs) and/or other ICs.

Power amplifier 240 may have the following transfer function:

$$y(x) = a_1 * x + a_2 * x^2 + a_3 * x^3 + \qquad \text{Eq (1)}$$

where x denotes an input RF signal provided to power amplifier 240, $a_1$, $a_2$ and $a_3$ are coefficients that define the linearity of power amplifier 240, and y(x) denotes an amplified RF signal from power amplifier 240.

For simplicity, higher order terms above third order are not shown in equation (1).

In equation (1), $a_1 * x$ is a linear term, with $a_1$ being the gain of power amplifier 240. Second-order non-linearity of power amplifier 240 is given by the term $a_2 * x^2$, and third-order non-linearity of power amplifier 240 is given by the term $a_3 * x^3$. Coefficients $a_2$ and $a_3$ determine the amount of second-order and third-order non-linearity, respectively. For an ideal power amplifier, $a_1$ is a non-zero value, and $a_2$ and $a_3$ are equal to zero. However, power amplifier 240 is inherently non-ideal and non-linear and would thus have a non-linear transfer function with non-zero values of $a_2$ and $a_3$. The coefficients in equation (1) may have values that are dependent on frequency, transmit power level, and/or other factors.

Figure 3:
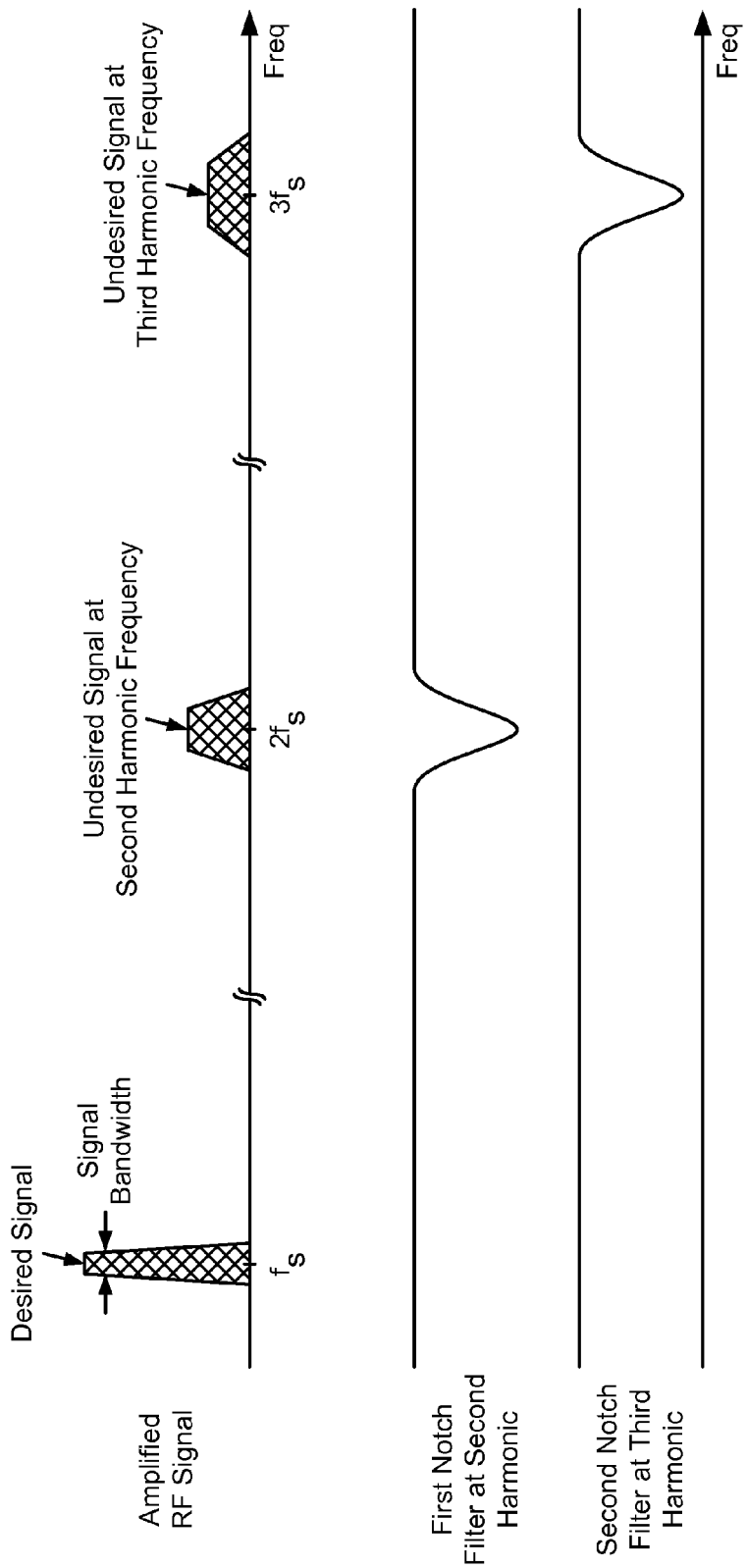
FIG. 3 shows a frequency spectrum of an amplified RF signal.

FIG. 3 shows a frequency spectrum of the amplified RF signal from power amplifier 240 in FIG. 2. Due to non-linearity of power amplifier 240, the amplified RF signal includes a desired signal at an operating frequency of $f_S$ (which is the frequency of the input RF signal) as well as an undesired signal at a second harmonic frequency of $2 f_S$, another undesired signal at a third harmonic frequency of $3 f_S$, etc. The magnitude of the undesired signal at the second harmonic frequency is dependent on coefficient $a_2$ in equation (1). The magnitude of the undesired signal at the third harmonic frequency is dependent on coefficient $a_3$ in equation (1).

Amplifiers such as power amplifier 240 in FIG. 2 are inherently nonlinear circuits. As a consequence, the amplified RF signal from power amplifier 240 includes an amplified replica of the input RF signal as well as undesired signals at harmonic frequencies of the input RF signal, as shown in FIG. 3. The amplitude of the undesired signals is typically required to be below specified levels given by spectral mask requirements. A lowpass filter may be coupled to the output of power amplifier 240 and may be used to attenuate the undesired signals at the harmonic frequencies while minimally attenuating the desired signal.

Some wireless systems, such as GSM systems, may impose strict emission requirements on the allowable output power emitted at the harmonic frequencies. In these wireless systems, a high order lowpass filter may be used to sufficiently attenuate the undesired signals at the harmonic frequencies in order to meet the strict emission requirements. However, the high order lowpass filter would include many circuit components (e.g., many inductors and capacitors) and would likely have more insertion loss in the operating band due to limited quality factor (Q) of the circuit components. The higher insertion loss may degrade power added efficiency (PAE) of power amplifier 240. Hence, high order lowpass filters are typically not used to attenuate undesired signals at harmonic frequencies due to higher cost, larger circuit area, greater inband insertion loss, and lower PAE.

Notch filters may be used to attenuate undesired signals at harmonic frequencies. A notch filter can provide a much sharper transition (or a notch) around a particular frequency, which is referred to as a notch frequency. A notch filter can typically provide high attenuation over a narrow frequency range, with the amount of attenuation and the bandwidth of the notch being dependent on the Q of circuit components used to implement the notch filter. A notch filter may have its notch placed at one of the harmonics of an input RF signal and may then be referred to as a harmonic trap.

As shown in FIG. 3, a first notch filter may have its notch placed at the second harmonic frequency of $2 f_S$ and may be used to attenuate the undesired signal at the second harmonic frequency. A second notch filter may have its notch placed at the third harmonic frequency of $3 f_S$ and may be used to attenuate the undesired signal at the third harmonic frequency. A notch filter may have a sharp transition between a passband and a stopband. Because of this sharp transition, the attenuation of a notch filter can decrease rapidly when the frequency of the input RF signal shifts away from the notch frequency. Hence, a notch filter should be carefully tuned, because of its sharp transition nature, in order to align its notch frequency with a harmonic frequency. For a fixed notch filter implemented with discrete circuit components, careful tuning may be achieved by changing component values or slightly modifying a printed circuit board on which the notch filter is implemented. However, in fully integrated circuit designs, the above-mentioned techniques may not be available.

Power amplifier 240 may be designed to support a wide overall operating band, which may cover a plurality of frequency bands. The overall operating band of power amplifier 240 may be as such as 10 to 15% of the center frequency of the power amplifier. For such a wideband power amplifier, a harmonic trap may provide the desired attenuation (which may be dependent on a particular application) over only a fraction of the overall operating band due to the sharp transition of the harmonic trap.

Figure 4:
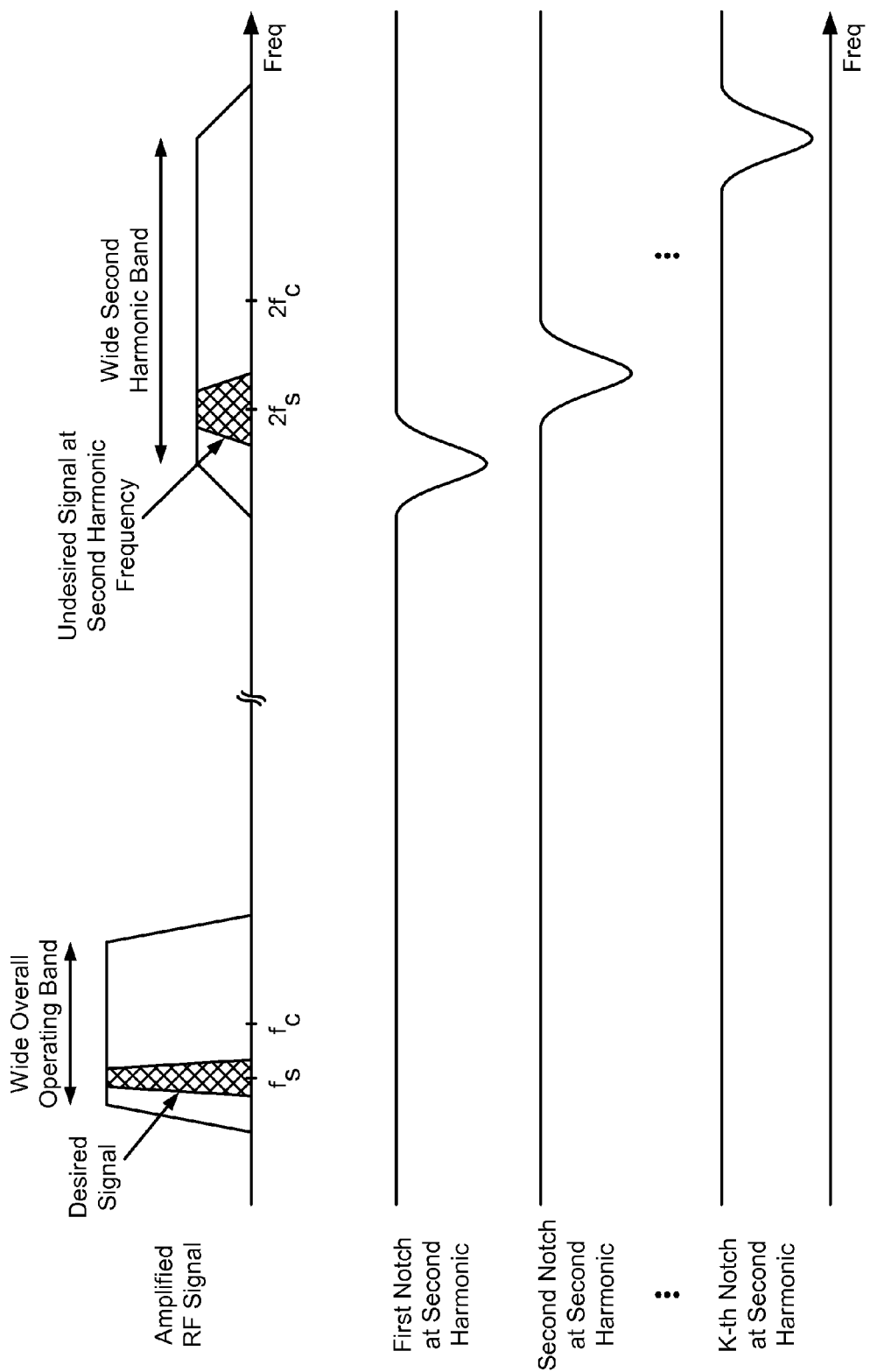
FIG. 4 shows a frequency spectrum of a wideband power amplifier.

FIG. 4 shows a frequency spectrum of wideband power amplifier 240. Power amplifier 240 may support a wide overall operating band centered at a frequency of $f_C$. An input RF signal provided to power amplifier 240 may be centered at a frequency of $f_S$, which may fall anywhere within the overall operating band. The wide overall operating band may be associated with a wide second harmonic band centered at a frequency of $2 f_C$. An undesired signal from power amplifier 240 may be centered at a frequency of $2 f_S$, which may fall anywhere within the wide second harmonic band.

As shown in FIG. 4, a set of K harmonic traps may be used to mitigate the limited bandwidth of each harmonic trap, where K may be any integer value greater than one. The K harmonic traps may have their notch frequencies staggered across the second harmonic band, as shown in FIG. 4. A desired amount of attenuation of an undesired signal may be achieved over a wider frequency range by proper placement of the notch frequencies of the K harmonic traps. Alternatively or additionally, greater attenuation of an undesired signal may be achieved at a particular frequency by placing multiple notch frequencies at or close to this particular frequency. Although not shown in FIG. 4 for simplicity, multiple sets of notch filters may be used for different harmonic frequencies, one set of notch filters for each harmonic frequency.

As shown in FIGS. 3 and 4, the same sharp transition nature that makes notch filters good candidates to filter undesired signals at harmonic frequencies also represents a challenge when an input RF signal (and hence, its harmonics) can vary significantly across frequency. Multiple harmonic traps may be used to provide the desired amount of attenuation over a wide harmonic band, e.g., as shown in FIG. 4. However, many harmonic traps may be required to provide the desired amount of attenuation and may result in higher cost, larger circuit area, and greater circuit complexity, all of which may be undesirable.

In an aspect, an impedance matching circuit with at least one tunable notch filter may be coupled to an output of a power amplifier and may be used to attenuate at least one undesired signal at least one harmonic frequency. The impedance matching circuit may be used to match an output impedance of the power amplifier to a load (e.g., an antenna). The impedance matching circuit may be implemented to include at least one tunable notch filter. Each tunable notch filter may have a notch that can be varied across frequency. The notch frequency of each tunable notch filter may be varied (e.g., to coincide with the frequency of an undesired signal) in order to provide better attenuation of the undesired signal. This tuning capability may allow a tunable notch filter to cover a wider frequency range, which may be advantageous given the sharp transition nature of the notch filter. The tuning capability may help to correct potential mis-tuning of the notch frequency due to inaccuracies in circuit design modeling, variations in circuit component values, etc.

FIG. 5 shows a block diagram of an exemplary design of a PA module 500 with an impedance matching circuit 550 having at least one tunable notch filter. PA module 500 includes a power amplifier 540 coupled to impedance matching circuit 550. Matching circuit 550 performs impedance matching between an output impedance of power amplifier 540 and an impedance of a load 554. Matching circuit 550 also includes at least one tunable notch filter to attenuate at least one undesired signal from power amplifier 540. Power amplifier 540 may correspond to power amplifier 240 in FIG. 2, and matching circuit 550 may correspond to matching circuit 250 in FIG. 2. Load 554 may correspond to duplexer 252 and/or antenna 254 in FIG. 2. By integrating at least one tunable notch filter within impedance matching circuit 550, only few additional circuit components may be sufficient to implement the at least one tunable notch filter. Furthermore, matching circuit 550 may be designed to exhibit a lowpass filter response to provide additional attenuation of undesired signals at harmonic frequencies.

FIG. 6 shows a schematic diagram of an impedance matching circuit 550a with four tunable notch filters, which is an exemplary design of impedance matching circuit 550 in FIG. 5. In this exemplary design, matching circuit 550a includes two L sections 650a and 650b coupled in series. An L section includes a series circuit component coupled to a shunt circuit component. A circuit component may be an inductor, a capacitor, a resistor, etc. A series circuit component is a circuit component coupled between two nodes, and a shunt circuit component is a circuit component coupled between a node and circuit ground.

Within the first L section 650a of matching circuit 550a, an inductor 652 and an adjustable capacitor 662 are coupled in parallel and between the input of matching circuit 550a and node A. An inductor 654 and an adjustable capacitor 664 are coupled in series, and the combination is coupled between node A and circuit ground. Within the second L section 650b of matching circuit 550a, an inductor 656 and an adjustable capacitor 666 are coupled in parallel and between node A and the output of matching circuit 550a. An inductor 658 and an adjustable capacitor 668 are coupled in series, and the combination is coupled between the output of matching circuit 550a and circuit ground.

As shown in FIG. 6, a notch filter may be formed by a series inductor and a series capacitor (e.g., inductor 652 and capacitor 662) coupled in parallel between two nodes. A notch filter may also be formed by a shunt inductor and a shunt capacitor (e.g., inductor 654 and capacitor 664) coupled in series between a node and circuit ground. Inductor 652 and capacitor 662 form a first tunable notch filter. Inductor 654 and capacitor 664 form a second tunable notch filter. Inductor 656 and capacitor 666 form a third tunable notch filter. Inductor 658 and capacitor 668 form a fourth tunable notch filter. A tunable notch filter may have an adjustable inductor and/or an adjustable capacitor to tune the notch frequency of the tunable notch filter. It may be simpler to implement an adjustable capacitor than an adjustable inductor. Hence, FIG. 6 shows four adjustable capacitors 662, 664, 666 and 668 for four tunable notch filters.

An impedance matching circuit may be implemented with two L sections and may include a series inductor, a shunt capacitor, another series inductor, and another shunt capacitor. A tunable notch filter may be formed by adding an adjustable capacitor (e.g., capacitor 662) in parallel with a series inductor (e.g., inductor 652). A tunable notch filter may also be formed by adding an inductor (e.g., inductor 654) in series with a shunt capacitor (e.g., capacitor 664) and making the capacitor adjustable. An impedance matching circuit may thus be easily designed with at least one tunable notch filter to attenuate at least one undesired signal.

In general, an impedance matching circuit may include any number of tunable notch filters. The tunable notch filters may have their notches placed at different harmonic frequencies and/or different frequencies over a wide harmonic band of a particular harmonic frequency. In one exemplary design, the tunable notch filter formed by inductor 654 and capacitor 664 in FIG. 4 may be tuned to the second harmonic frequency, and the tunable notch filter formed by inductor 658 and capacitor 668 may also be tuned to the second harmonic frequency. The tunable notch filter formed by inductor 652 and capacitor 662 may be tuned to the third harmonic frequency, and the tunable notch filter formed by inductor 656 and capacitor 666 may also be tuned to the third harmonic frequency.

FIG. 6 shows an exemplary design of impedance matching circuit 550a with tunable notch filters. An impedance matching circuit with tunable notch filters may also be implemented based on other circuit designs, some of which are described below.

FIG. 7A shows a schematic diagram of an impedance matching circuit 550b with a tunable notch filter, which is another exemplary design of impedance matching circuit 550 in FIG. 5. Matching circuit 550b includes (i) a series inductor 712 coupled between the input and output of matching circuit 550b, (ii) an adjustable capacitor 714 coupled in parallel with inductor 712, and (iii) an adjustable shunt capacitor 716 coupled between the output of matching circuit 550b and circuit ground. A tunable notch filter is formed by inductor 712 and capacitor 714.

FIG. 7B shows a schematic diagram of an impedance matching circuit 550c with two tunable notch filters, which is yet another exemplary design of impedance matching circuit 550 in FIG. 5. Matching circuit 550c includes (i) a series inductor 722 coupled between the input of matching circuit 550c and node B, (ii) an adjustable capacitor 724 coupled in parallel with inductor 722, (iii) an adjustable shunt capacitor 726 coupled between node B and circuit ground, (iv) a series inductor 728 coupled between node B and the output of matching circuit 550c, and (v) an adjustable capacitor 730 coupled in parallel with inductor 728. A first tunable notch filter is formed by inductor 722 and capacitor 724. A second tunable notch filter is formed by inductor 728 and capacitor 730.

FIG. 7C shows a schematic diagram of an impedance matching circuit 550d with two tunable notch filters, which is yet another exemplary design of impedance matching circuit 550 in FIG. 5. Matching circuit 550d includes (i) a shunt inductor 742 coupled to the input of matching circuit 550d, (ii) an adjustable capacitor 744 coupled in series with inductor 742 and further to circuit ground, (iii) a series capacitor 746 coupled between the input and output of matching circuit 550d, (iv) a shunt capacitor 748 coupled between the output of matching circuit 550d and circuit ground, (v) a shunt inductor 750 coupled to the output of matching circuit 550d, and (vi) an adjustable capacitor 752 coupled in series with inductor 750 and further to circuit ground. A first tunable notch filter is formed by inductor 742 and capacitor 744. A second tunable notch filter is formed by inductor 750 and capacitor 752.

Some exemplary designs of impedance matching circuits with at least one tunable notch filter have been described above in FIGS. 6 to 7C. In general, an impedance matching circuit may include any number of stages. More stages may be used to increase bandwidth, provide more flexibility in impedance matching, reduce loss by reducing an impedance transform ratio of each stage, and/or provide other benefits at the expense of more circuit components. Each stage may be implemented based on an L topology, an R topology, a T topology, a Pi topology, etc. The L topology includes a series circuit component coupled to a shunt circuit component, e.g., as shown in FIG. 7A. The R topology includes a shunt circuit component coupled to a series circuit component. The T topology includes a series circuit component coupled to a shunt circuit component and also to another series circuit component. The Pi topology includes a shunt circuit component coupled to a series circuit component, which is coupled to another shunt circuit component. Different circuit topologies may be more suitable for different nominal output impedances of a power amplifier. For example, some circuit topologies may be more suitable when an output impedance appears inductive whereas other circuit topologies may be more suitable when the output impedance appears capacitive.

In general, a suitable impedance matching circuit with at least one tunable notch filter may be used for a power amplifier. The impedance matching circuit may include any number of tunable notch filters. Each tunable notch filter may be implemented with an inductor and an adjustable capacitor, e.g., as shown in FIGS. 6 to 7C. The at least one tunable notch filter may enable attenuation of undesired signals over a wide frequency range at each harmonic frequency of interest in order to meet spurious emission requirements.

An adjustable capacitor in a tunable notch filter may be implemented in various manners. In an exemplary design, an adjustable capacitor may be implemented with a variable capacitor (varactor) having a capacitance that can be adjusted based on an analog control voltage. In another exemplary design, an adjustable capacitor may be implemented with a bank of capacitors that can be selected or unselected to change capacitance. In any case, an adjustable capacitor in a tunable notch filter may be varied to adjust the notch frequency and improve attenuation of an undesired signal.

Figure 8:
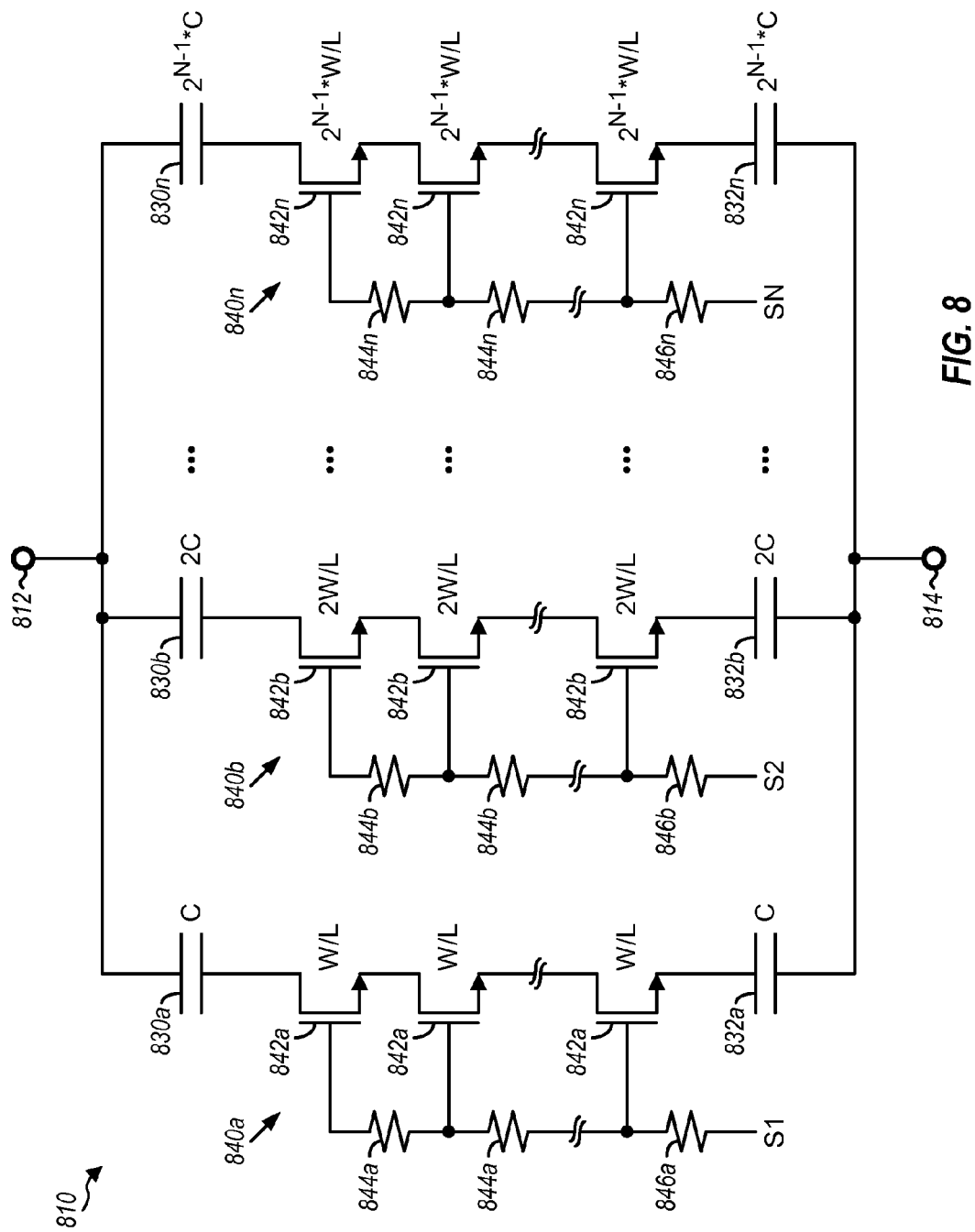
FIG. 8 shows a schematic diagram of an adjustable capacitor.

FIG. 8 shows a schematic diagram of an exemplary design of an adjustable capacitor 810 implemented with switchable capacitors. Adjustable capacitor 810 may be used for any of the adjustable capacitors in FIGS. 6 to 7C. In the exemplary design shown in FIG. 8, adjustable capacitor 810 is implemented with N pairs of switchable capacitors, where N may be any integer value. Each pair of switchable capacitors includes capacitors 830 and 832 coupled in series with an associated high-power switch 840. High-power switch 840 is implemented with multiple N-channel metal oxide semiconductor (NMOS) transistors 842 coupled in a stack. The stack of NMOS transistors can distribute a large signal swing of the amplified RF signal so that each NMOS transistor can observe only a fraction of the large signal swing. A resistor 844 is coupled between the gates of consecutive NMOS transistors in the stack. A resistor 846 has one end coupled to the gate of the bottommost NMOS transistor in the stack and the other end receiving a control signal for the associated switch 840.

In the exemplary design shown in FIG. 8, N switchable capacitors 830a to 830n have one end coupled to a first terminal 812 and the other end coupled to one end of switches 840a to 840n, respectively. N switchable capacitors 832a to 832n have one end coupled to a second terminal 814 and the other end coupled to the other end of switches 840a to 840n, respectively. Switches 840a to 840n receive N control signals S1 to SN, respectively. Each switch 840 may be opened or closed based on its associated control signal, which may be applied to a low-voltage end of the stack of NMOS transistors for that switch, as shown in FIG. 8.

FIG. 8 shows an exemplary design in which adjustable capacitor 810 includes N branches, with each branch including two switchable capacitors 830 and 832 coupled in series with one switch 840. A branch may also include a single capacitor (e.g., only capacitor 830 or only capacitor 832) coupled in series with a switch.

In one exemplary design, the N capacitors 830a to 830n (and also the N capacitors 832a to 832n) may have different capacitances, e.g., of C, 2 C, 4 C, etc., where C is a base unit of capacitance. In another exemplary design, the N capacitors 830a to 830n (and also the N capacitors 832a to 832n) may have the same capacitance of C.

NMOS transistors 842 used to implement switches 840 coupled to switchable capacitors 830 and 832 may be designed with appropriate transistor sizes to provide a target Q or better for all capacitors. In the exemplary design shown in FIG. 8, NMOS transistors 842 have sizes that are proportional to the sizes of their associated capacitors 830 and 832.

Hence, NMOS transistors 842a for switch 840a (which is coupled to capacitors 830a and 832a each having a capacitance of C) may each have a transistor size of W/L, where W is the width and L is the length of an NMOS transistor. NMOS transistors 842b for switch 840b (which is coupled to capacitors 830b and 832b each having a capacitance of 2 C) may each have a transistor size of 2 W/L. NMOS transistors 842 for remaining switches 840 may similarly have sizes determined based on the capacitances of their associated capacitors 830 in order to obtain a target Q or better for the capacitors.

An adjustable capacitor may be designed to have a suitable tuning range of capacitance values. In an exemplary design with N=4 in FIG. 8, adjustable capacitor 810 may be designed to have a tuning range of approximately C to 15 C. This tuning range may be much larger than a typical tuning range of an adjustable capacitor in an impedance matching circuit. The larger tuning range may enable the notch frequency to be tuned over a wider range. In general, the tuning range of an adjustable capacitor in a tunable notch filter may be dependent on an application for which the tunable notch filter is used. The tunable notch filter may be required to cover only one frequency band, and a tuning range of 15 to 20% may be sufficient. A tunable notch filter may also be required to cover a wide frequency range (e.g., including the second or third harmonic), and the tuning range may be much greater. A wider tuning range for an adjustable capacitor may enable a tunable notch filter to be varied over a wider frequency range but may result in lower Q for the adjustable capacitor.

In an exemplary design, a fixed inductor may be used for a tunable notch filter, as described above and shown in FIGS. 6 to 7C. In another exemplary design, an adjustable inductor may be used for a tunable notch filter. The adjustable inductor may be varied in coarse steps, e.g., by connecting or disconnecting different sections of the inductor. Course tuning of the inductor may be used for switching between frequency bands and/or for other purposes.

An impedance matching circuit with at least one tunable notch filter may be controlled in various manners. In one exemplary design, a tunable notch filter may be adjusted based on pre-characterization of the notch filter. For example, the notch frequency may be characterized (e.g., during the circuit design phase or the manufacturing phase) for different possible settings of an adjustable capacitor in the tunable notch filter. The notch frequencies and their associated settings for the notch filter may be stored in a look-up table (e.g., in memory 212 in FIG. 2). The characterization may be performed for each tunable notch filter in the impedance matching circuit. The characterization may be performed by computer simulation, lab measurements, factory measurements, field measurements, etc. Thereafter, the setting of each tunable notch filter that can provide the desired attenuation for the current operating frequency may be retrieved from the look-up table and applied to the impedance matching circuit.

In another exemplary design, an impedance matching circuit with at least one tunable notch filter may be dynamically adjusted, e.g., during operation. For example, one or more parameters such as signal power may be measured for different possible settings of a tunable notch filter. The setting that can provide the best performance, as measured by the one or more parameters, may be selected for use.

In yet another exemplary design, an impedance matching circuit with at least one tunable notch filter may be adjusted based on a combination of pre-characterization of the matching circuit and dynamic adjustment. For example, the performance of the impedance matching circuit may be pre-characterized, and the setting that can provide good performance at a frequency of interest may be retrieved from the look-up table and applied to the impedance matching circuit. The impedance matching circuit may then be dynamically adjusted (e.g., within a more narrow range around a nominal value corresponding to the selected setting) during operation.

An impedance matching circuit with at least one tunable notch filter may also be adjusted in other manners. In any case, the impedance matching circuit may include a plurality of settings. Each setting may correspond to a different set of values for all adjustable capacitors in the impedance matching circuit. The impedance matching circuit may enable a power amplifier to achieve good performance (e.g., in terms of rejection of undesired signals at harmonic frequencies) over a wide operating band.

Figure 9A:
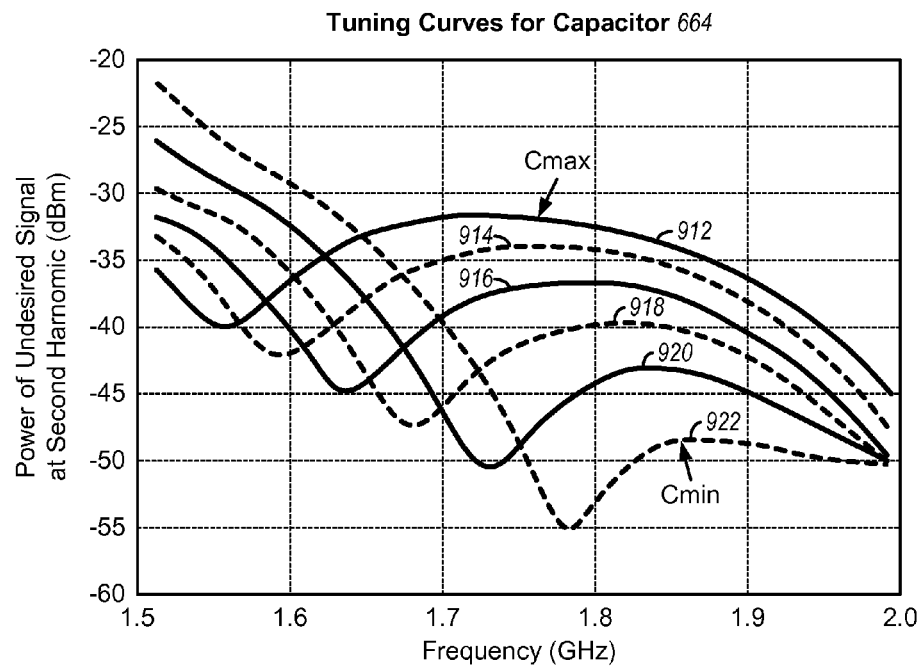
FIGS. 9A and 9B show output power of an undesired signal for different adjustable capacitor values.

FIG. 9A shows output power of an undesired signal at the second harmonic frequency for different values of adjustable capacitor 664 in a tunable notch filter formed by inductor 654 and capacitor 664 in FIG. 6. In FIG. 9A, the horizontal axis represents frequency and is given in units of giga-Hertz (GHz). The vertical axis represents the output power of the undesired signal at the second harmonic frequency and is given in units of dBm. A plot 912 shows the output power of the undesired signal at the second harmonic frequency versus frequency for a maximum value (Cmax) of capacitor 664 in FIG. 6. Plots 914 to 922 show the output power of the undesired signal for progressively smaller values of capacitor 664.

Figure 9B:
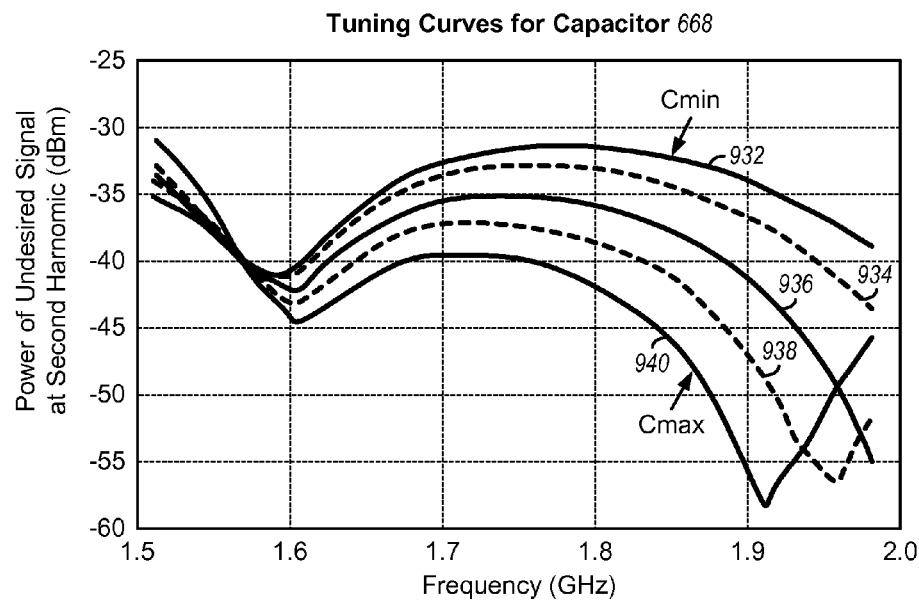

FIG. 9B shows output power of an undesired signal at the second harmonic frequency for different values of adjustable capacitor 668 in the tunable notch filter formed by inductor 658 and capacitor 668 in FIG. 6. In FIG. 9B, the horizontal axis represents frequency, and the vertical axis represents the output power of the undesired signal at the second harmonic frequency. A plot 932 shows the output power of the undesired signal at the second harmonic frequency versus frequency for a lowest value (Cmin) of capacitor 668 in FIG. 6. Plots 934 to 940 show the output power of the undesired signal for progressively larger value of capacitor 668.

A power amplifier may be implemented in various manners, e.g., with various types of transistors and based on various circuit designs. An exemplary design of a power amplifier is described below.

Figure 10:
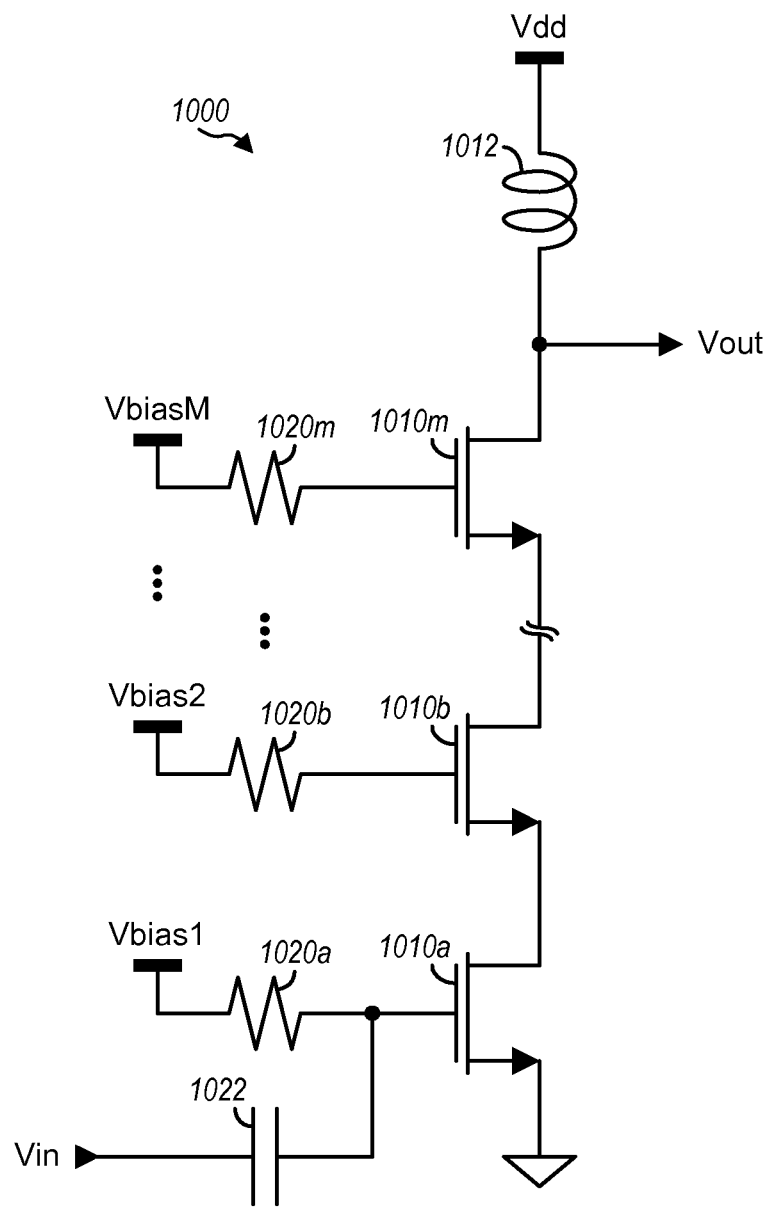
FIG. 10 shows a schematic diagram of a power amplifier.

FIG. 10 shows a schematic diagram of a power amplifier 1000, which is one exemplary design of power amplifier 240 in FIG. 2 and power amplifier 540 in FIGS. 5 and 6. Power amplifier 1000 includes M NMOS transistors 1010a through 1010m coupled in a stack, where M may be any integer value. The bottommost NMOS transistor 1010a has its source coupled to circuit ground and its gate receiving an input signal (Vin) via an alternating current (AC) coupling capacitor 1022. Each higher up NMOS transistor 1010 in the stack has its source coupled to the drain of another NMOS transistor below in the stack. The topmost NMOS transistor 1010m has its drain providing an amplified RF signal (Vout). A load inductor 1012 is coupled between a supply voltage (Vdd) and the drain of the topmost NMOS transistor 1010m and provides DC bias current for power amplifier 1000. Load inductor 1012 may be part of an impedance matching circuit for power amplifier 1000. The gates of NMOS transistors 1010a to 1010m receive M bias voltages, Vbias1 through VbiasM, via M resistors 1020a through 1020m, respectively. The bias voltages may be generated to turn on power amplifier 1000 when it is enabled and to turn off power amplifier 1000 when it is disabled.

The amplified RF signal from power amplifier 1000 may have a large voltage swing, which may exceed a breakdown voltage of each NMOS transistor 1010. The large voltage swing of the amplified RF signal may be split or distributed approximately equally across the M NMOS transistors 1010a to 1010m. Each NMOS transistor 1010 may then observe only a fraction of the voltage swing, which may be less than the breakdown voltage of each NMOS transistor in order to achieve high reliability. The M bias voltages Vbias1 through VbiasM may be selected to provide the desired voltage splitting of the amplified RF signal, e.g., so that each NMOS transistor 1010 observes approximately 1/M-th of the voltage swing.

FIG. 10 shows an exemplary design of a power amplifier, which may also be implemented in other manners. For example, a power amplifier may be implemented with transistors of other types, or other circuit designs, etc. The number of stacked transistors, the transistor size, the load inductor, the bias current, the bias voltages, and/or other circuit characteristics may be selected based on the requirements of a power amplifier.

In an exemplary design, an apparatus (e.g., a wireless device, an IC, a circuit module, etc.) may comprise a power amplifier and an impedance matching circuit, e.g., as shown in FIG. 5. The power amplifier (e.g., power amplifier 540 in FIG. 5) may amplify an input RF signal and provide an amplified RF signal. The impedance matching circuit (e.g., impedance matching circuit 550 in FIG. 5) may perform output impedance matching for the power amplifier. The impedance matching circuit may comprise at least one tunable notch filter to attenuate at least one undesired signal in the amplified RF signal.

In one exemplary design, the impedance matching circuit may include a series-coupled tunable notch filter formed by an inductor and an adjustable capacitor. The inductor (e.g., inductor 652 or 656 in FIG. 6) may be coupled in series in a signal path between an input and an output of the impedance matching circuit. The adjustable capacitor (e.g., capacitor 662 or 666 in FIG. 6) may be coupled in parallel with the inductor.

In another exemplary design, the impedance matching circuit may include a shunt-coupled tunable notch filter formed by an inductor and an adjustable capacitor. The inductor (e.g., inductor 654 or 658 in FIG. 6) may be coupled to a node of the impedance matching circuit. The adjustable capacitor (e.g., capacitor 664 or 668 in FIG. 6) may be coupled in series with the inductor. The combination of the inductor and the adjustable capacitor may be coupled between the node and circuit ground.

In another exemplary design, the impedance matching circuit may include both series-coupled and shunt-coupled tunable notch filters. The impedance matching circuit may include a first tunable notch filter formed by a first inductor and a first adjustable capacitor coupled in parallel. The impedance matching circuit may further include a second tunable notch filter formed by a second inductor and a second adjustable capacitor coupled in series.

In an exemplary design, the at least one tunable notch filter may comprise a tunable notch filter tuned to a second harmonic frequency of the amplified RF signal. This tunable notch filter may attenuate an undesired signal at the second harmonic frequency. In another exemplary design, the at least one tunable notch filter may comprise a tunable notch filter tuned to a third harmonic frequency of the amplified RF signal. This tunable notch filter may attenuate an undesired signal at the third harmonic frequency.

In yet another exemplary design, the at least one tunable notch filter may comprise (i) a first tunable notch filter to attenuate a first undesired signal at the second harmonic of the amplified RF signal and (ii) a second tunable notch filter to attenuate a second undesired signal at a third harmonic of the amplified RF signal. In general, the impedance matching circuit may include any number of tunable notch filters, which may cover any number of harmonics and any harmonic of the amplified RF signal.

In an exemplary design, the power amplifier may operate over a plurality of frequency bands. For example, the power amplifier may operate over a wide operating band covering 10 percent or more of a center frequency of the power amplifier. The at least one tunable notch filter may be tunable over a frequency range corresponding to the plurality of frequency bands.

In an exemplary design, the at least one tunable notch filter may comprise at least one adjustable capacitor, e.g., as shown in FIGS. 6 to 7C. Each adjustable capacitor may comprise at least one switchable capacitor that is selected or unselected based on a respective control signal for that adjustable capacitor.

In an exemplary design, the at least one tunable notch filter may comprise an adjustable capacitor including first and second switchable capacitors and first and second sets of transistors. The first switchable capacitor (e.g., capacitor 830a in FIG. 8) may have a first capacitor size, and the second switchable capacitor (e.g., capacitor 830b in FIG. 8) may have a second capacitor size. The first set of transistors (e.g., NMOS transistors 842a in FIG. 8) may operate as a switch for the first switchable capacitor, may be coupled to the first switchable capacitor, and may have a first transistor size. The second set of transistors (e.g., NMOS transistors 842b in FIG. 8) may operate as a switch for the second switchable capacitor, may be coupled to the second switchable capacitor, and may have a second transistor size. In an exemplary design, the second capacitor size may be twice the first capacitor size, and the second transistor size may be twice the first transistor size, e.g., as shown in FIG. 8. In an exemplary design, the first and second transistor sizes may be determined based on the first and second capacitor sizes to maintain an approximately constant Q for the first and second capacitors. The adjustable capacitor may also include additional switchable capacitors and additional sets of transistors operating as switches for the additional switchable capacitors.

In an exemplary design, the apparatus may further comprise a look-up table to store a plurality of settings for each of the at least one tunable notch filter. The look-up table may receive an indication of a current operating frequency and may provide one of the plurality of settings corresponding to the current operating frequency for each tunable notch filter.

Figure 11:
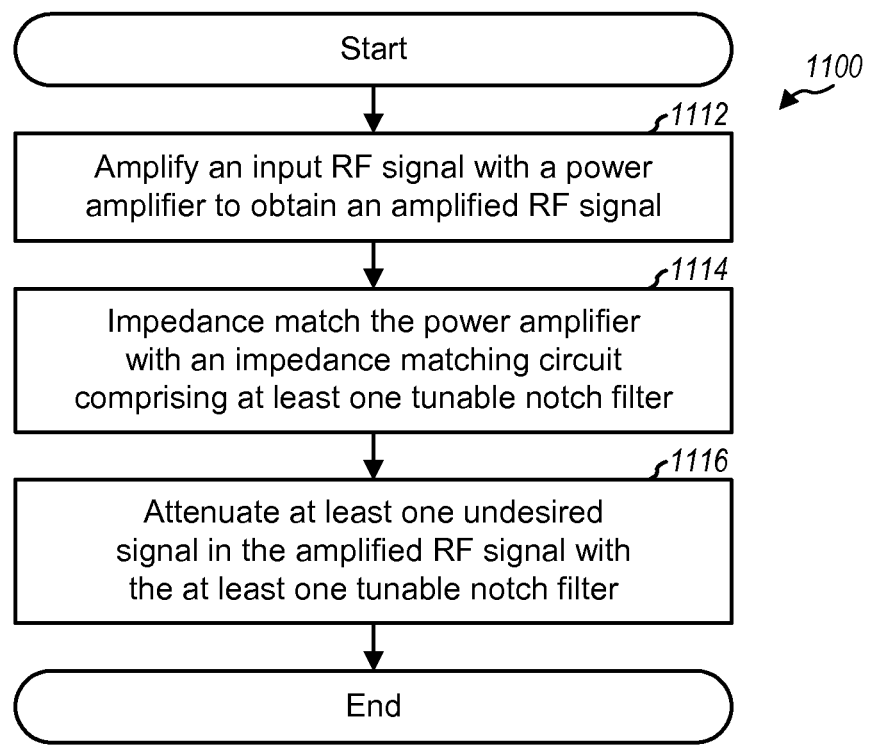
FIG. 11 shows a process performed by a wireless device.

FIG. 11 shows an exemplary design of a process 1100 performed by a wireless device. An input RF signal may be amplified with a power amplifier to obtain an amplified RF signal (block 1112). Impedance matching may be performed for the power amplifier with an impedance matching circuit comprising at least one tunable notch filter (block 1114). At least one undesired signal in the amplified RF signal may be attenuated with the at least one tunable notch filter (block 1116).

In an exemplary design of block 1116, a first undesired signal at a second harmonic of the amplified RF signal may be attenuated with a first tunable notch filter in the at least one tunable notch filter. In an exemplary design, a second undesired signal at a third harmonic of the amplified RF signal may be attenuated with a second tunable notch filter in the at least one tunable notch filter. Undesired signals at the second, third, and/or other harmonics of the amplified RF signal may be attenuated with additional tunable notch filters.

An impedance matching circuit with at least one tunable notch filter for a power amplifier, as described herein, may be implemented on an IC, an analog IC, an RFIC, a mixed-signal IC, an ASIC, a printed circuit board (PCB), an electronic device, etc. The power amplifier and the impedance matching circuit may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing an impedance matching circuit with at least one tunable notch filter may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
    a power amplifier configured to amplify an input radio frequency (RF) signal and provide an amplified RF signal; and
    an impedance matching circuit coupled to the power amplifier and configured to match an output impedance of the power amplifier, the impedance matching circuit comprising at least one tunable notch filter dynamically adjusted during operation in response to a change in operating band of the input RF signal to attenuate at least one undesired signal in the amplified RF signal.

2. The apparatus of claim 1, the impedance matching circuit comprising:
    an inductor coupled in series in a signal path between an input and an output of the impedance matching circuit: and
    an adjustable capacitor coupled in parallel with the inductor, the inductor and the adjustable capacitor forming one of the at least one tunable notch filter.

3. The apparatus of claim 1, the impedance matching circuit comprising:
    an inductor coupled to a node of the impedance matching circuit; and
    an adjustable capacitor coupled in series with the inductor, the inductor and the adjustable capacitor being coupled between the node and circuit ground and forming one of the at least one tunable notch filter.

4. The apparatus of claim 1, the impedance matching circuit comprising:
    a first tunable notch filter formed by a first inductor and a first adjustable capacitor coupled in parallel; and
    a second tunable notch filter formed by a second inductor and a second adjustable capacitor coupled in series.

5. The apparatus of claim 1, the at least one tunable notch filter comprising a tunable notch filter tuned to a second harmonic frequency of the amplified RF signal and configured to attenuate an undesired signal at the second harmonic frequency.

6. The apparatus of claim 1, the at least one tunable notch filter comprising a tunable notch filter tuned to a third harmonic frequency of the amplified RF signal and configured to attenuate an undesired signal at the third harmonic frequency.

7. The apparatus of claim 1, the at least one tunable notch filter comprising:
    a first tunable notch filter configured to attenuate a first undesired signal at a second harmonic of the amplified RF signal; and
    a second tunable notch filter configured to attenuate a second undesired signal at a third harmonic of the amplified RF signal.

8. The apparatus of claim 1, wherein the power amplifier is configured to operate over a plurality of frequency bands, and wherein the at least one tunable notch filter is tunable over a frequency range corresponding to the plurality of frequency bands.

9. The apparatus of claim 1, the at least one tunable notch filter comprising at least one adjustable capacitor, each adjustable capacitor comprising at least one switchable capacitor that is selected or unselected based on a control signal for the adjustable capacitor.

10. The apparatus of claim 1, the at least one tunable notch filter comprising an adjustable capacitor.

11. The apparatus of claim 10, the adjustable capacitor comprising:
    a first switchable capacitor having a first capacitor size;
    a first set of transistors coupled to the first switchable capacitor and having a first transistor size;
    a second switchable capacitor having a second capacitor size; and
    a second set of transistors coupled to the second switchable capacitor and having a second transistor size.

12. The apparatus of claim 11, wherein the second capacitor size is twice the first capacitor size, and wherein the second transistor size is twice the first transistor size.

13. The apparatus of claim 11, wherein the first and second transistor sizes are determined based on the first and second capacitor sizes to obtain a target quality factor (Q) or better for the first and second capacitors.

14. The apparatus of claim 1, further comprising:
a look-up table configured to store a plurality of settings for each of the at least one tunable notch filter, to receive an indication of a current operating frequency, and to provide one of the plurality of settings corresponding to the current operating frequency for each of the at least one tunable notch filter.

15. A method comprising:
amplifying an input radio frequency (RF) signal with a power amplifier to obtain an amplified RF signal;
impedance matching the power amplifier with an impedance matching circuit comprising at least one tunable notch filter dynamically adjusted during operation in response to a change in operating band of the input RF signal to attenuate at least one undesired signal in the amplified RF signal; and
attenuating the at least one undesired signal in the amplified RF signal with the at least one tunable notch filter.

16. The method of claim 15, the attenuating at least one undesired signal comprising attenuating a first undesired signal at a second harmonic of the amplified RF signal with a first tunable notch filter in the at least one tunable notch filter.

17. The method of claim 16, the attenuating at least one undesired signal further comprising attenuating a second undesired signal at a third harmonic of the amplified RF signal with a second tunable notch filter in the at least one tunable notch filter.

18. An apparatus comprising:
means for amplifying an input radio frequency (RF) signal to obtain an amplified RF signal;
means for impedance matching the means for amplifying, the means for amplifying comprising at least one tunable notch dynamically adjusted during operation in response to a change in operating band of the input RF signal to attenuate at least one undesired signal in the amplified RF signal; and
means for attenuating the at least one undesired signal in the amplified RF signal with the at least one tunable notch.

19. The apparatus of claim 18, the means for attenuating at least one undesired signal comprising means for attenuating a first undesired signal at a second harmonic of the amplified RF signal with a first tunable notch in the at least one tunable notch.

20. The apparatus of claim 19, the means for attenuating at least one undesired signal further comprising means for attenuating a second undesired signal at a third harmonic of the amplified RF signal with a second tunable notch in the at least one tunable notch.

* * * * *